(12) United States Patent
Takaki

(10) Patent No.: US 6,775,336 B1
(45) Date of Patent: Aug. 10, 2004

(54) RECEIVER AND GAIN CONTROL METHOD OF THE SAME

(75) Inventor: Tetsuya Takaki, Tokyo (JP)

(73) Assignee: NEC Corporation, Tokyo (JP)

( * ) Notice: Subject to any disclaimer, the term of this patent is extended or adjusted under 35 U.S.C. 154(b) by 728 days.

(21) Appl. No.: 09/590,519

(22) Filed: Jun. 9, 2000

(30) Foreign Application Priority Data

Jun. 9, 1999 (JP) .......................................... 11-161765

(51) Int. Cl.$^7$ .......................... H04L 27/08; H04B 1/10
(52) U.S. Cl. ...................... 375/345; 375/130; 375/316; 455/245.2
(58) Field of Search ................................. 375/345–350, 375/130, 316, 322, 323, 329–332; 455/234.1, 234.2, 245.2

(56) References Cited

U.S. PATENT DOCUMENTS 4,972,430 A * 11/1990 Cantwell .................... 375/130
5,493,712 A * 2/1996 Ramesh et al. .......... 455/234.2

FOREIGN PATENT DOCUMENTS

JP          10126301        of 1998

* cited by examiner

Primary Examiner—Chieh M. Fan
Assistant Examiner—Edith Chang
(74) Attorney, Agent, or Firm—Dickstein, Shapiro, Morin & Oshinksy, LLP.

(57) ABSTRACT

A plurality of target values for generating a gain control signal are provided such that switching is performed between the target values with a baseband signal processing unit. Specifically, the baseband signal processing unit monitors the state of a received signal to select an appropriate one of the target values based on the monitoring result. The selected target value is compared with a received power amount to generate the gain control signal. When saturation occurs at input ends of A/D converters for digital processing of the received signal, the target value is switched to the next lower target value. Thus, even when the received signal includes an interference wave in addition to a desired wave, saturation at the input ends of the A/D converters due to the interference wave is prevented, thereby making it possible to maintain favorable reception characteristics and suppression of an increased bit error rate in digital communication.

21 Claims, 7 Drawing Sheets

RECEIVER AND GAIN CONTROL METHOD OF THE SAME

BACKGROUND OF THE INVENTION

1. Field of the Invention

The present invention relates to a receiver and a gain control method thereof, and more particularly to a control scheme of a gain control amplifier provided in a radio section forming part of a receiver in mobile communication.

2. Description of the Related Art

Generally, in radio communication such as mobile communication, it is known that received power at an antenna terminal of a receiver largely varies due to the strength of radio waves depending on the distance between a transmitter and the receiver or due to the strength of radio waves depending on topographic conditions of a site where the transmitter communicates with the receiver. When the received power at the antenna terminal varies, there exists not only the need for setting a wide range of input power to a demodulator forming part of the receiver, but also the problem of failing to ensure stable reception characteristics due to the varying received power.

To address the problems, the receiver is provided with a gain control amplifier capable of controlling gain in a relatively later stage in a radio section forming part of the receiver and in a stage previous to the demodulator such that the gain of the gain control amplifier is controlled in accordance with variations in received power at the antenna terminal to maintain constant input power to the demodulator and to ensure stable reception characteristics.

Next, the control method of the gain control amplifier is described in detail. First, a received signal is demodulated in the receiver and the received power amount is derived from the demodulated received signal. Next, the derived received power amount is compared with a target value held in the receiver, and if the derived received power amount is lower than the target value, control is performed such that the gain of the gain control amplifier is increased. On the other hand, if the derived received power amount is higher than the target value, control is performed such that the gain of the gain control amplifier is reduced. In this manner, the input power amount to the demodulator is adjusted to be constant and stable reception characteristics can be realized.

FIG. 1 shows a configuration of the aforementioned receiver. The receiver shown in FIG. 1 comprises antenna 101 for receiving signals transmitted from a base station and for transmitting signals transmitted from a mobile station, antenna sharing device 102 for separating received signals and transmitted signals, high frequency amplifier 103 for amplifying a received signal in a radio frequency band, high pass filter 104 for passing only the frequency band of the received signal, frequency converter 105 for frequency converting the received signal in the radio frequency band into a received signal in an intermediate frequency band, channel filter 106 for passing only the signal of a received channel of the frequency converted received signal, gain control amplifier 107 capable of controlling gain, orthogonal demodulator 108, baseband filters 109 and 110, local signal oscillators 111 and 112, transmitter 113, and digital signal processing unit 114.

In the receiver configured as shown in FIG. 1, the received signal received at antenna 101 is inputted to high frequency amplifier 103 for amplification through antenna sharing device 102. The amplified output is inputted to frequency converter 105 through high pass filter 104. At frequency converter 105, the received signal in the radio frequency band is frequency converted into a received signal in the intermediate frequency band using a locally oscillated signal outputted from local signal oscillator 111, and then the converted signal is outputted.

The received signal in the intermediate frequency band outputted from frequency converter 105 is inputted to orthogonal demodulator 108 through gain control amplifier 107 after channel filter 106 filters out any interference wave existing near the received channel. At orthogonal demodulator 108, the received signal in the intermediate frequency band is frequency converted into a received signal in a baseband using a locally oscillated signal outputted from local signal oscillator 112, and the received signal is orthogonal demodulated for output as a received I component signal and a received Q component signal. Thereafter, the received I component signal and the received Q component signal are inputted to digital signal processing unit 114 through baseband filters 109 and 110, respectively.

Digital signal processing unit 114 converts analog signals into digital signals and performs digital signal processing such as error correction, and in addition, calculates the received power from the received signal to perform gain control of gain control amplifier 107.

Next, the control operation of gain control amplifier 107 is described in detail with reference to FIG. 2. It should be noted that FIG. 2 shows the details of the portions for processing the received signal in the intermediate frequency band and the portions for processing the received signal in the baseband (corresponding to digital processing unit 114 in FIG. 1) forming part of the aforementioned receiver, and the components equivalent to those in FIG. 1 are denoted with the same reference numerals. Since the portions of the receiver for processing the received signal in the high frequency band overlaps with the portions in FIG. 1, the description thereof is omitted.

Digital signal processing unit 114 comprises A/D converters 206 and 207 for receiving outputs from baseband filters 109 and 110 as their inputs, respectively, baseband digital filters 208 and 209, baseband signal processing unit 210, control signal generating unit 211, and power calculator 212.

The received I component signal and the received Q component signal outputted from orthogonal demodulator 108 are inputted to baseband filters 109 and 110, respectively, where any interference wave existing near the received signals is removed. Thereafter, the received I and Q signals are converted from analog signals into digital signals at A/D converters 206 and 207, respectively, and inputted to baseband digital filters 208 and 209. Baseband digital filters 208 and 209 respectively filter out any interference wave existing near the received channel and limit the bands for preventing intersymbol interference in the digital signals, and then the signals are inputted to baseband signal processing unit 210 and to power calculator 212, respectively.

Baseband signal processing unit 210 performs digital signal processing such as error correction. The interference wave existing near the received channel is sufficiently attenuated in three stages using channel filter 106, baseband filters 109 and 110, and baseband digital filters 208 and 209. Power calculator 212 calculates the received power amount from the received I and Q components signals and outputs the calculation result of the received power to control signal generating unit 211.

Control signal generating unit 211 compares the received power amount inputted from power calculator 212 with a target value held in control signal generating unit 211, and controls gain control amplifier 107 in accordance with the comparison result. Specifically, if the received power amount is lower than the target value, a control signal for increasing the gain of gain control amplifier 107 is generated to cause gain control amplifier 107 to increase its gain. Alternatively, if the received power amount is higher than the target value, a control signal for reducing the gain of gain control amplifier 107 is generated to cause gain control amplifier 107 to reduce its gain. The target value held in control signal generating unit 211 is a predetermined value so as to prevent saturation at input ends of A/D converters 206 and 207.

Next, a case is considered where the conventional receiver shown in FIG. 1 and FIG. 2 receives both a desired wave and an interference wave which exists with strong power to the desired wave in an adjacent channel to a received channel within a receiving frequency band. The desired wave and interference wave received at antenna 101 are inputted to channel filter 106 through high frequency amplifier 103, high pass filter 104, and frequency converter 105. In the conventional receiver shown in FIG. 1 and FIG. 2, since the interference wave existing near the received signal is attenuated in a total of three stages using channel filter 106, baseband filters 109 and 110, and baseband digital filters 208 and 209, the interference wave cannot be sufficiently attenuated only with channel filter 106. For this reason, the desired wave is inputted to gain control amplifier 107 with some interference wave remaining.

The received signal including the desired wave and some interference wave is orthogonal demodulated at orthogonal demodulator 108 after passing through gain control amplifier 107, and then baseband filters 109 and 110 again filter out the interference wave. However, the interference wave is not sufficiently removed, and the desired wave together with some remaining interference wave is inputted to A/D converters 206 and 207 for conversion from analog signal into digital signal, and then inputted to baseband digital filters 208 and 209 which sufficiently remove the interference wave of the received signal including the desired wave and interference wave. The signal is then inputted to power calculator 212 and to baseband signal processing unit 210.

Power calculator 212 calculates the received power amount of the received signal and outputs the calculation result to control signal generating unit 211 as described above. However, despite the reception of both desired wave and interference wave, the interference wave is sufficiently attenuated by channel filter 106, baseband filters 109 and 110, and baseband digital filters 208 and 209. Thus, the received power is not correctly calculated and control signal generating unit 211 is notified of the received power amount calculated only from the desired wave.

Control signal generating unit 211 compares the received power amount with the target value held in control signal generating unit 211 to generate a control signal for controlling the gain of gain control amplifier 107. If the received power amount of the received signal is lower than the target value, control signal generating unit 211 generates a control signal for increasing the gain of gain control amplifier 107 to increase the gain of gain control amplifier 107.

As described above, when the conventional receiver in a mobile unit shown in FIG. 1 and FIG. 2 receives both a desired wave and an interference wave which exists with strong power to the desired wave in an adjacent channel to a received channel, gain control amplifier 107 receives as its input the interference wave in addition to the desired wave and amplifiers both of them. However, the gain control signal for gain control amplifier 107 is a control signal obtained after the interference wave has been sufficiently removed. Therefor, the interference wave causes saturation at the input ends of A/D converters 206 and 207 to result in disadvantages that favorable reception characteristics can not be obtained and the bit error rate is increased in digital communication.

When reference is made to the technology in JP-A-10-126301 proposed by the present inventor, it discloses the invention for controlling the gain of a receiver with emphasis on a characteristic as found that an nth order (n≧2) distortion component caused by nonlinearity of a high frequency amplifier or frequency mixer forming part of the receiver is increased or reduced by na (dB) in proportion to an increase or reduction in electrical field intensity by a (dB).

Specifically, a variable gain amplifier is provided at a front end of the receiver and, after the reception of a transmitted signal at the receiver, if attenuation of the gain amount of the variable gain amplifier by a (dB) resulting from control of the gain amount causes the electrical field level of the received signal to be attenuated by b (dB) or smaller (a<b), the control of the gain amount of the variable gain amplifier is not performed since it is considered that no cross modulation from the interference wave occurs. When attenuation of the gain amount by a (dB) causes the electrical field level of the received signal to be attenuated by b (dB) or larger, the gain amount of the variable gain amplifier is further controlled since it is considered that cross modulation occurs from a plurality of interference waves, such that the gain amount is increased up to a value at which no influence due to cross modulation is found in the bit error rate of the received signal.

The aforementioned technology in JP-A-10-126301 assumes a cross modulation wave as an interference wave of interest, but does not contemplates the aforementioned case where a receiver receives both desired wave and interference wave which exists with strong power to the desired wave in an adjacent channel to a received channel.

SUMMARY OF THE INVENTION

It is an object of the present invention to provide a receiver and a gain control method thereof which, even when a received signal includes not only a desired wave but also an interference wave with strong power adjacent thereto, can prevent saturation at input ends of an A/D converters caused by the interference wave to maintain favorable reception characteristics and to suppress an increase in bit error rate in digital communication.

According to the present invention, a receiver is provided. The receiver comprising selecting means for selectively deriving a desired wave in a received wave, gain control amplifying means for amplifying an output from the selecting means, demodulating means for demodulating the amplified output, and gain control means for comparing a power amount corresponding to the demodulated output with selected and set one of a plurality of target values to control gain of the gain control amplifying means in accordance with the comparison result, wherein the gain control means includes target value switching control means for switching the one target value to another target value in accordance with the presence or absence of an interference wave contained in the demodulated output.

In addition, the receiver further comprises digital signal processing means for digitally processing a baseband signal which is the demodulated output from the demodulating means. The digital signal processing means includes a digital converter for digitizing the baseband signal and a filter for filtering out the interference wave component from the digital signal. The target value switching control means includes interference wave detecting means for detecting the presence or absence of the interference wave based on an output power amount from the filter and a saturated operation state of the digital converter.

The target values includes a predetermined first target value and a predetermined second target value which is lower than the first target value. The target value switching control means sets the first target value at an initial state, and switches to the second target value when the interference wave detecting means detects the interference wave in that state. The first target value is predetermined such that a received power amount at an input terminal of the digital converter causes no saturated operation of the converter in a normal receiving state with no interference wave present.

The receiver further comprises digital signal processing means for digitally processing a baseband signal which is the demodulated output from the demodulating means. The digital signal processing means includes a digital converter for digitizing the baseband signal and a filter for filtering out the interference wave components from the digital signal. The target value switching control means includes interference wave detecting means for detecting the presence or absence of the interference wave based on an output power amount from the filter and a state of the digital signal.

The interference wave detecting means detects an error rate as an output state of the digital signal, and detects the presence or absence of the interference wave based on the error rate. The interference wave detecting means detects the presence of the interference wave when the error rate is equal to or higher than a predetermined threshold value.

The target value switching control means switches the target value from an initial set value to a second target value which is lower than the initial set value by a certain amount when the error rate is equal to or higher than the threshold value, and further switches the target value from the second target value to a third target value which is lower than the second target value by a certain amount when the error rate is equal to or higher than the threshold value. The target value switching control means stops switching of the target value only when the error rate becomes lower than the threshold value. The target value switching control means switches the target value to the initial set value after a certain time has elapsed after the stop of switching of the target value.

According to the present invention, a method of controlling gain in a receiver is provided. The method comprises the steps of selectively deriving a desired wave in a received wave, amplifying the selected output, demodulating the amplified output, digitally processing and outputting the demodulated output, comparing a power amount corresponding to the demodulated output with selected one of a plurality of target values for a power amount, amplifying the selected output in accordance with the comparison result, and controlling switching of the selected one target value in accordance with the presence or absence of an interference wave contained in the demodulated output.

The receiver is designed to digitize a baseband signal which is the demodulated output with a digital converter to filter out the interference wave component from the digital signal with a filter. The target value switching control step includes an interference wave detecting step for detecting the presence or absence of the interference wave based on an output power amount from the filter and a saturated operation state of the digital converter.

The interference wave detecting step detects the saturated operation state when the digital converter provides a continuous maximum output. The target values includes a predetermined first target value and a predetermined second target value which is lower than the first target value. The target value switching control step sets the first target value at an initial state, and switches to the second target value when the interference wave detecting step detects the interference wave in that state. The first target value is predetermined such that a received power amount at an input terminal of the digital converter causes no saturated operation of the converter in a normal receiving state with no interference wave present.

In addition, the receiver is designed to digitize a baseband signal which is the demodulated output with a digital converter to filter out the interference wave components from the digital signal with a filter. The target value switching control step includes interference wave detecting step for detecting the presence or absence of the interference wave based on an output power amount from the filter and an output state of the digital signal.

The interference wave detecting step detects an error rate as the output state of the digital signal, and detects the presence or absence of the interference wave based on the error rate such that it detects the presence of the interference wave when the error rate is equal to or higher than a predetermined threshold value. The target value switching control step switches the target value from an initial set value to a second target value which is lower than the initial set value by a certain amount when the error rate is equal to or higher than the threshold value, and further switches the target value from the second target value to a third target value which is lower than the second target value by a certain amount when the error rate is equal to or higher than the threshold value. The target value switching control step stops switching of the target value only when the error rate becomes lower than the threshold value.

As described above, although a single target value is conventionally set for generating a gain control signal, in the present invention, a plurality of target values are set which can be switched at a baseband signal processing unit. Specifically, the baseband signal processing unit monitors the power amount of the demodulated baseband signal and the state of the digital signal, and switches the initial set target value to the second target value which is lower than the initial value in response to a continuous high digital signal, a deteriorated bit error rate or the like. The target value is compared with the received power amount to control the gain of the gain control amplifier.

When a deteriorated state of the demodulated digital signal causes a deteriorated bit error rate or the like, A/D converters are at a saturated state since the input power at the inputs ends of the A/D converters is increased. Thus, it can be considered that any interference wave is included in the received signal. In this case, control for reducing the target value is performed to accordingly reduce the power at the input ends of the A/D converters, thereby achieving favorable characteristics such as the bit error rate of the demodulated digital signal or the like.

The above objects, features, and advantages of the present invention will become apparent from the following description based on the accompanying drawings which illustrate examples of preferred embodiments of the present invention.

DETAILED DESCRIPTION OF THE PREFERRED EMBODIMENTS

Figure 1:
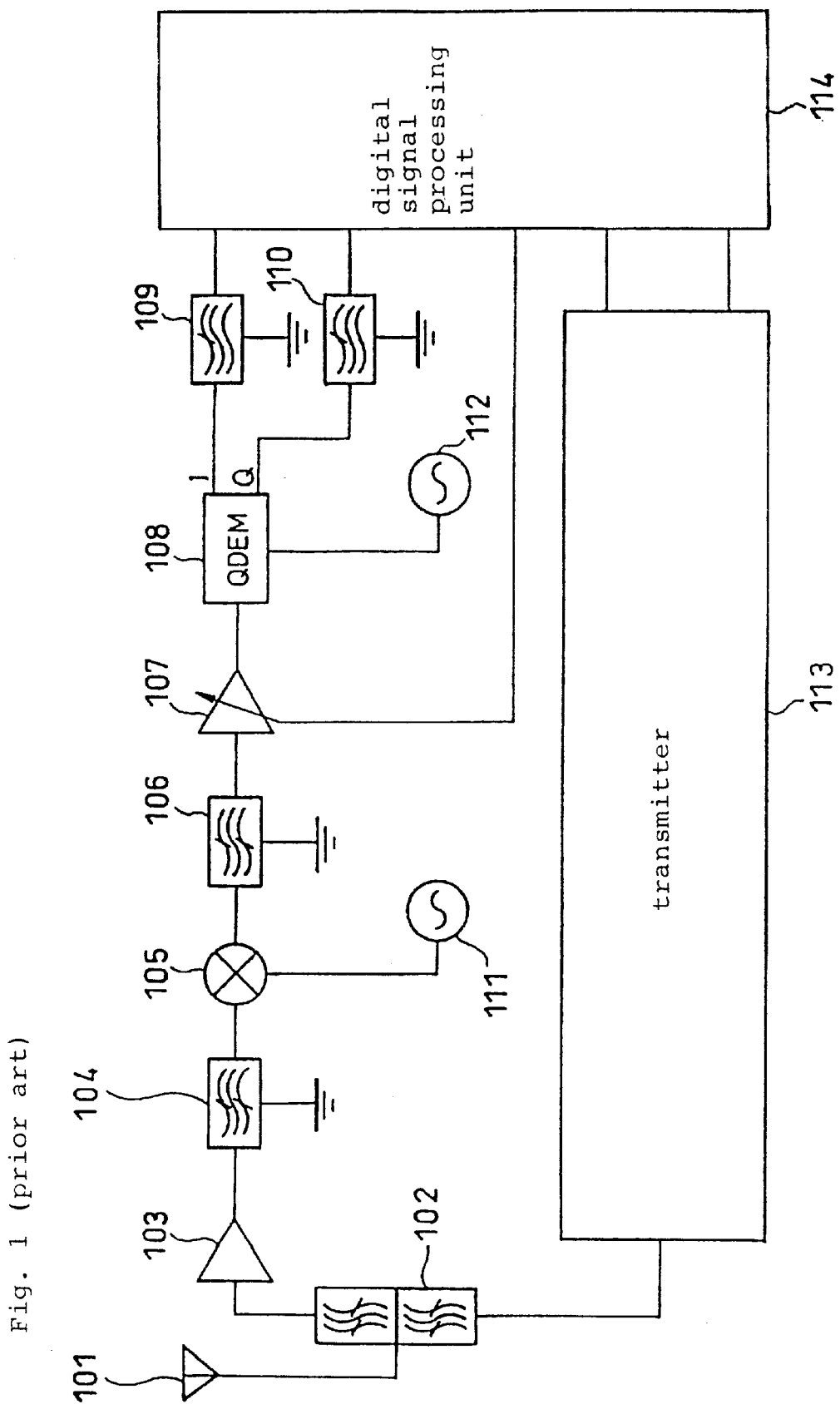
FIG. 1 is a block diagram showing a schematic configuration of a conventional mobile radio.
Figure 2:
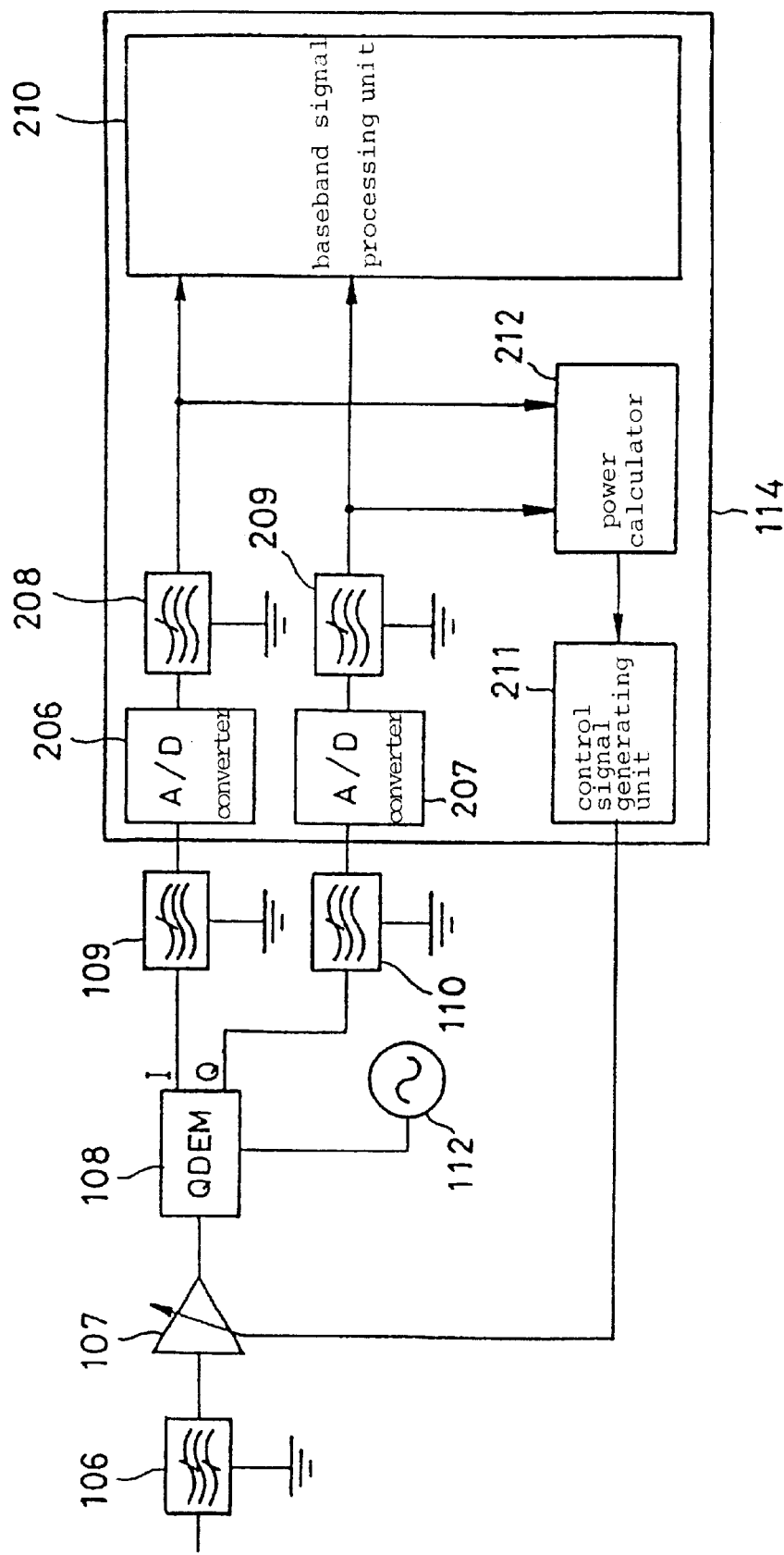
FIG. 2 is a diagram showing an example of a configuration of a receiving section in the conventional mobile radio.
Figure 3:
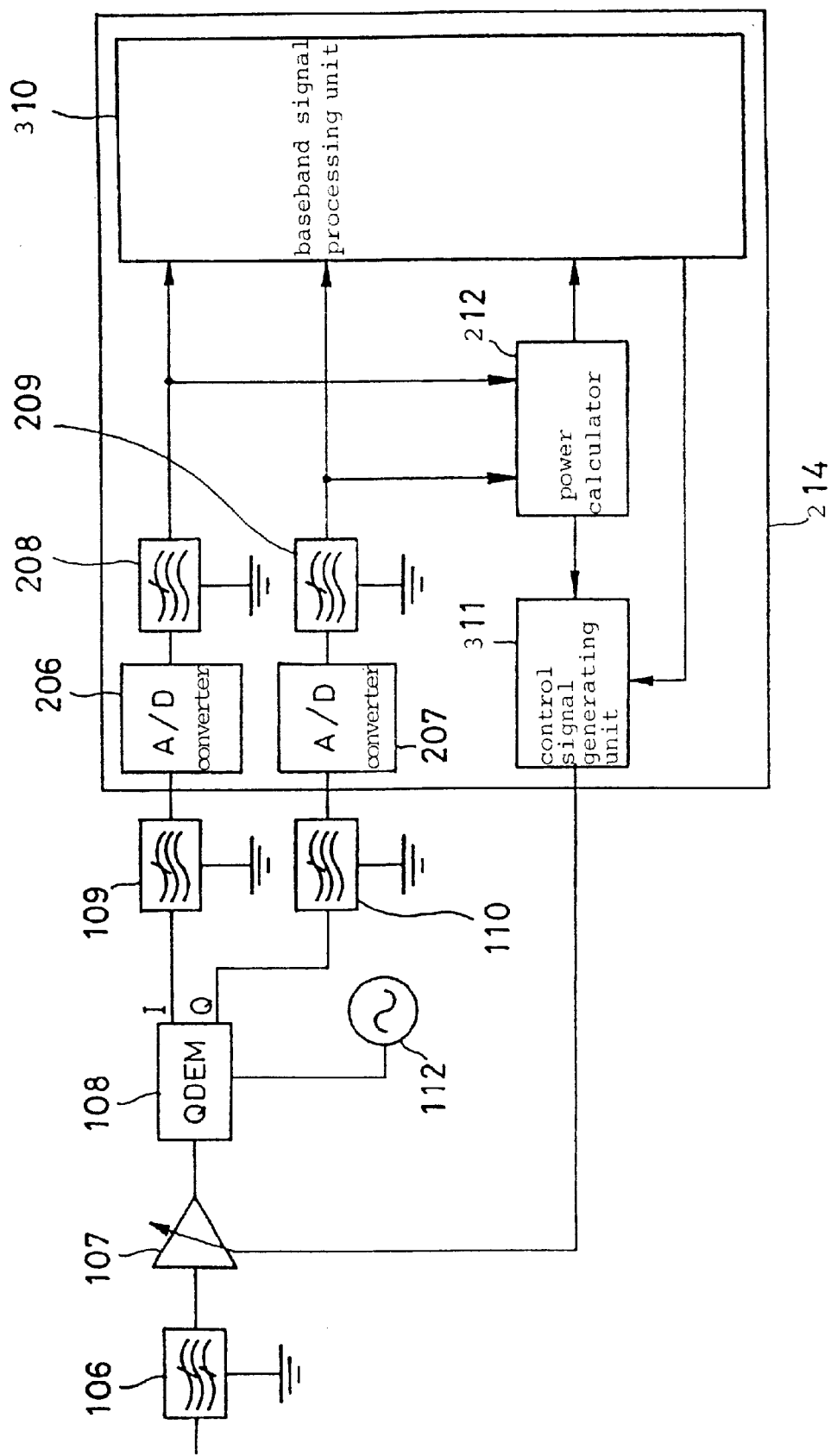
FIG. 3 is a block diagram showing an embodiment of the present invention.

Embodiments of the present invention are hereinafter described with reference to the drawings. FIG. 3 is a diagram showing an embodiment of the present invention, in which the components equivalent to those in FIG. 1 and FIG. 2 are denoted with the same reference numerals. It should be noted that the entire configuration of a receiver in the embodiment is equal to that of the prior art shown in FIG. 1, and the description thereof is omitted. In the embodiment, since the detailed configuration of digital signal processing unit 214 is different from that of digital signal processing unit 114 in FIG. 1, only digital signal processing unit 214 is described.

Referring to FIG. 3, digital signal processing unit 214 comprises A/D converters 206 and 207 for converting outputted signals from baseband filters 109 and 110 from analog signals to digital signals, respectively, baseband digital filters 208 and 209 for filtering out interference waves existing near a received channel and for limiting the bands of the received signals to prevent intersymbol interference in the digital signals, baseband signal processing unit 310 for performing digital signal processing such as error correction for the received signals, power calculator 212 for calculating the power amount of the received signal, and control signal generating unit 311 having a plurality of target values for comparing the power value from power calculator 212 with one of the plurality of target values to generate a signal for controlling the gain of gain control amplifier 107. Baseband signal processing unit 310 mentioned above has a function for selecting and setting one of the plurality of target values in control signal generating unit 311.

In such a configuration, the received signals outputted from baseband digital filters 208 and 209, respectively, are inputted to baseband signal processing unit 310 for digital signal processing such as error correction and also inputted to power calculator 212. Power calculator 212 calculates the received power amount from the inputted received signals and outputs the calculated received power amount to control signal generating unit 311 and to baseband signal processing unit 310.

Control signal processing unit 311 compares one of the target values selected and set by baseband signal processing unit 310 with the received power amount to generate a signal for controlling the gain of gain control amplifier 107. If the received power amount inputted to control signal generating unit 311 is lower than the selected target value, a control signal for increasing the gain of gain control amplifier 107 is generated. If the received power amount inputted to control signal generating unit 311 is higher than the target value, a control signal for reducing the gain of gain control amplifier 107 is generated.

The target values held in control signal generating unit 311 are values determined to cause no saturation at input ends of A/D converters 206 and 207. In the present invention, as described above, control signal generating unit 311 holds the plurality of target values and baseband signal processing unit 310, acting as target value switching control means, monitors the receiving state such that switching is performed between the plurality of target values held in control signal generating unit 311 in accordance with the receiving state.

With this configuration, if the receiver simultaneously receives a desired wave and an interference wave which exists with strong power to the desired wave in an adjacent channel to a received channel and baseband signal processing unit 310, acting as interference wave detecting means, determines that the interference wave exists in the adjacent channel from the present receiving state, then a signal for switching of the target values held in control signal generating unit 311 is generated to change the target value in control signal generating unit 311, thus preventing saturation at the respective input ends of A/D converters 206 and 207 due to the power of the interference wave.

Baseband signal processing unit 310 uses the received power amount notified from power calculator 212 and the digital signals outputted from A/D converters 206 and 207 to determine that the interference wave exists when a high value is continuously detected in digital values outputted from A/D converters 206 and 207 with respect to the notified received power amount.

Therefore, when an interference wave with strong power exists in an adjacent channel to a received channel and the receiver simultaneously receives a desired wave and the interference wave, the saturation at the input ends of A/D converters 206 and 207 can be prevented based on the state of the received signal. Thus, it is effectively possible to prevent deteriorated reception characteristics due to the interference wave with strong power existing in the adjacent channel to the received channel or to prevent an increase in bit error rate in digital communication.

The details of the control method of gain control amplifier 107 is hereinafter described with reference to FIG. 3. The received signal which has been orthogonal demodulated at orthogonal demodulator 108 and converted at A/D converters 206 and 207 from analog signal to digital signal is inputted to baseband digital filters 208 and 209. The received signal passed through baseband digital filters 208 and 209 is inputted to baseband signal processing unit 310 and to power calculator 212.

Power calculator 212 calculates the received power from the inputted received I component signal and the received Q component signal and outputs the calculation result to control signal generating unit 311 and to baseband signal processing unit 310. Control signal generating unit 311, which holds in advance the target values for output power of a signal outputted from gain control amplifier 107, acts as gain control means and compares one of the held target values with the received power amount. With this comparison result, a control signal for increasing the gain of gain control amplifier 107 is generated if the received power amount is lower than the target value, or a control signal for reducing the gain of gain control amplifier 107 is generated if the received power amount is higher than the target value, thereby adjusting the input power to A/D converters 206 and 207 to be constant and controlling the gain of gain control amplifier 107 to cause no saturation at the input ends of A/D converters 206 and 207.

In the receiver according to the present invention, the target values held in control signal generating unit 311 are a value α which is predetermined such that the received power amount at the input ends of A/D converters 206 and 207 causes no saturation of these converters in a normal reception state with no interference wave present, and a value β which is sufficiently smaller than the value α (α>β). In an initial state, control signal generating unit 311 uses the target value a to control the gain of gain control amplifier 107.

Next, the control method of gain control amplifier 107 is described for a case where the receiver simultaneously receives a desired wave and an interference wave which exists with strong power to the desired wave in an adjacent channel to a received channel. First, the receiver controls the gain of gain control amplifier 107 using the target value a as described above. Thereafter, when the receiver begins receiving the desired wave and the interference wave with strong power existing in the adjacent channel to the desired wave, the received signal including the desired wave and the interference wave is passed through antenna 101, antenna sharing device 102, high frequency amplifier 103, high pass filter 104, and frequency converter 105, and then inputted to channel filter 106.

Channel filter 106 cannot sufficiently attenuate the interference wave existing in the channel adjacent to the desired wave, and the desired wave and the interference wave existing in the channel adjacent to the desired wave are inputted to gain control amplifier 107 where the signal is amplified by the gain determined by the received power amount of the received signal and the target value α in control signal generating unit 311, and outputted from gain control amplifier 107. Then the signal is passed through orthogonal demodulator 108 and is outputted to baseband filters 109 and 110, respectively. Baseband filters 109 and 110 attenuate only the interference wave of the received signal including the desired wave and the interference wave and output the attenuated signal to A/D converters 206 and 207.

The received signal inputted to A/D converters 206 and 207 is converted from analog signal to digital signal and outputted to baseband digital filters 208 and 209. Baseband digital filters 208 and 209 sufficiently attenuate only the interference wave of the inputted received signal including the desired wave and the interference wave and limit the band for preventing intersymbol interference in the digital signal, and then the signal is outputted to baseband signal processing unit 310 and to power calculator 312.

Power calculator 212 calculates the received power of the received signal and outputs the calculation result to control signal generating unit 311 as described above. The received power of the received signal calculated at power calculator 212 is the received power only of the desired wave since the interference wave has been sufficiently attenuated by channel filter 106, baseband filters 109 and 110, and baseband digital filters 208 and 209.

Control signal generating unit 311 compares the received power of the received signal received from power calculator 212 with the target value α, and the aforementioned control operation is performed such that a control signal for controlling the gain of gain control amplifier 107 is generated to control the gain of gain control amplifier 107.

However, since gain control amplifier 107 receives not only the desired wave but also the interference wave existing in the channel adjacent to the desired wave, the desired wave and the interference wave are amplified by the gain set for gain control amplifier 107 and then outputted. As a result, A/D converters 206 and 207 receive the desired wave and the interference wave which have been amplified by the gain set for gain control amplifier 107. In other words, A/D converters 206 and 207 receive the power including the power of the interference wave in addition to the power of the desired wave, causing saturation at the input ends of A/D converters 206 and 207 with the power of the interference wave.

Since A/D converters 206 and 207 are saturated at the input ends, respective outputs from A/D converters 206 and 207 are at constant values irrespective of variations in received power at the input terminal of antenna 101. The digital signals inputted to power calculator 312, baseband digital filters 208 and 209, and baseband signal processing unit 310 are also at constant values.

When the inputted digital signal is at a constant value, baseband signal processing unit 310 decides that the interference wave exists in the channel adjacent to the received channel using the calculation result of the received power transmitted from power calculator 212 and the inputted digital values to generate a signal for switching of the target value used by control signal generating unit 311. Control signal generating unit 311 switches the target value α to the target value β based on the switching signal generated from baseband signal processing unit 310 to generate a signal for controlling the gain of gain control amplifier 107.

Since the target value α and the target value β have the relationship of α>β as described above, the gain of gain control amplifier 107 is controlled for reduction to reduce the output power from gain control amplifier 107, thereby eliminating the saturation at the input ends of A/D converters 206 and 207. For a method of deciding the saturation at the input ends of A/D converters 206 and 207 in baseband signal processing unit 310 as described above, the digital value inputted to baseband signal processing unit 310 may be monitored, and if the inputted digital value becomes discontinuous, it may be determined that A/D converters 206 and 207 becomes saturated at the input ends, in which case the objects of the present invention can also be accomplished.

Figure 4:
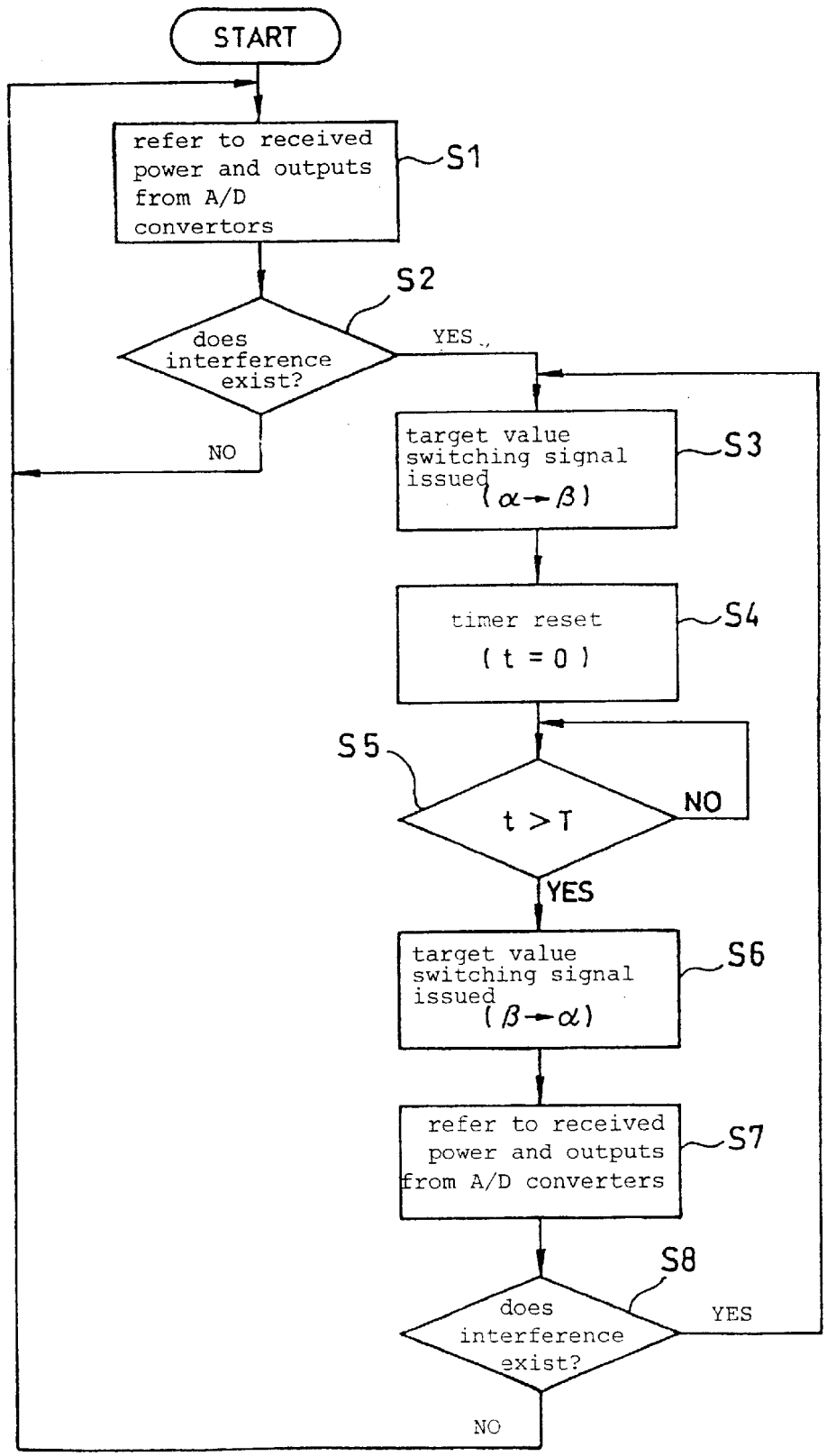
FIG. 4 is a flow chart illustrating the operation of the embodiment of the present invention.

FIG. 4 shows a flow chart showing the operation of the aforementioned embodiment. First, reference is made to the received power calculated by power calculator 212 and the respective outputs from A/D converters 206 and 207 (step S1), and the presence or absence of any interference wave is detected (step S2). Specifically, if abnormality in the A/D converted outputs, i.e. a continuous maximum digital signal output is found while the received power is controlled at a target value (the initial set value α in this case), it is considered that the interference wave is mixed, and an instruction is issued to control signal generating unit 311 for generating a target value switching signal (step S3). Thus, the target value is switched to the second value β.

At the same time, timer reset (t=0) is performed (step S4), and a certain time T has elapsed (step S5), then a target value switching signal is generated to return from the current second value β to the initial set value α (step S6). The target value remains at the second value β for the time T because the mixing of the interference wave is temporary. The time T may be set at a value equal to the gain control period of gain control amplifier 107, being the sampling period (T=0.625 ms) of the A/D converters, but the time T is not specifically limited thereto.

Further, reference is made to the received power and the outputs from the A/D converters (step S7), and the presence or absence of the interference wave is detected (step S8), and if the interference wave is present, the processing from step S3 to S7 is repeated. If no interference wave is detected at step S8, the processing returns to first step S1.

Figure 5:
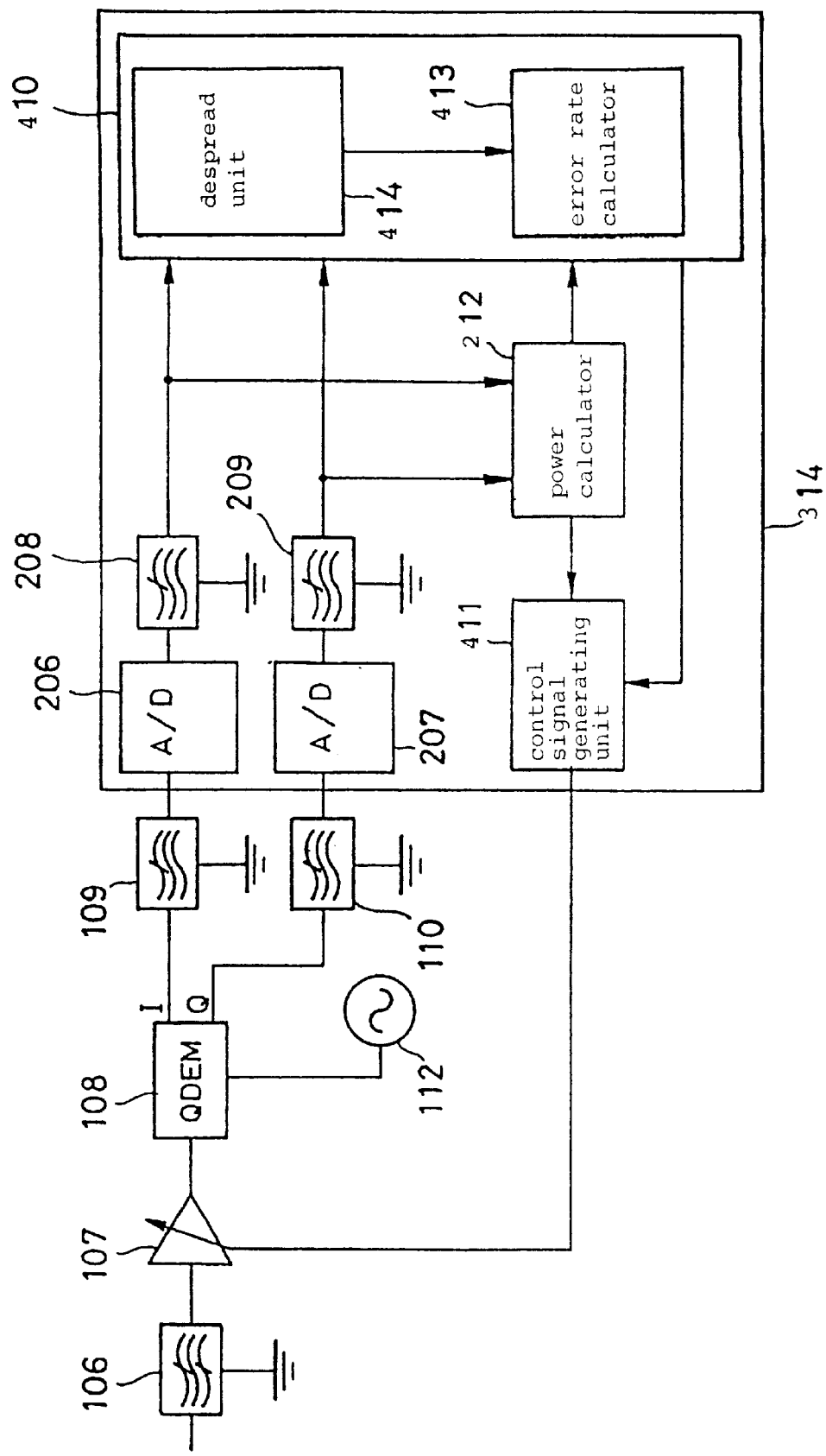
FIG. 5 is a block diagram showing another embodiment of the present invention.

FIG. 5 shows another embodiment of the present invention, and the components equivalent to those in FIG. 3 are denoted with the same reference numerals. In the embodiment, the block diagram showing the entire configuration of a receiver is also equivalent to that of the prior art shown in FIG. 1, and the description thereof is omitted. Since the embodiment differs from the embodiment in FIG. 3 in the aspect of switching control for setting target values in control signal generating unit 411, description is made only for that aspect.

Baseband signal processing unit 410 includes despread unit 414 for demodulating a spread signal and error rate calculator 413 for calculating the error rate of the signal resulting from despread unit 410. It should be noted that despread unit 414 and error rate calculator 413 are not particularly provided but commonly provided in a mobile communication device and well known. In the embodiment, switching control for setting target values in control signal generating unit 411 is performed based on the calculation result by error rate calculator 413.

Assuming that gain control amplifier 107 receives as its input a desired wave and an interference wave as described above, gain control amplifier 107 amplifies the desired wave and the interference wave by the gain set therefor and then outputs the amplified waves, resulting in saturation at input ends of A/D converters 206 and 207 due to the power of the interference wave as described above. Since the saturation at the input ends of A/D converters 206 and 207 due to the interference wave causes deterioration of the bit error rate calculated by error rate calculator 413, it can be seen that not only the desired wave but also the interference wave is received at antenna 101, and processing is performed for changing the target value currently set in control signal generating unit 411.

Figure 6:
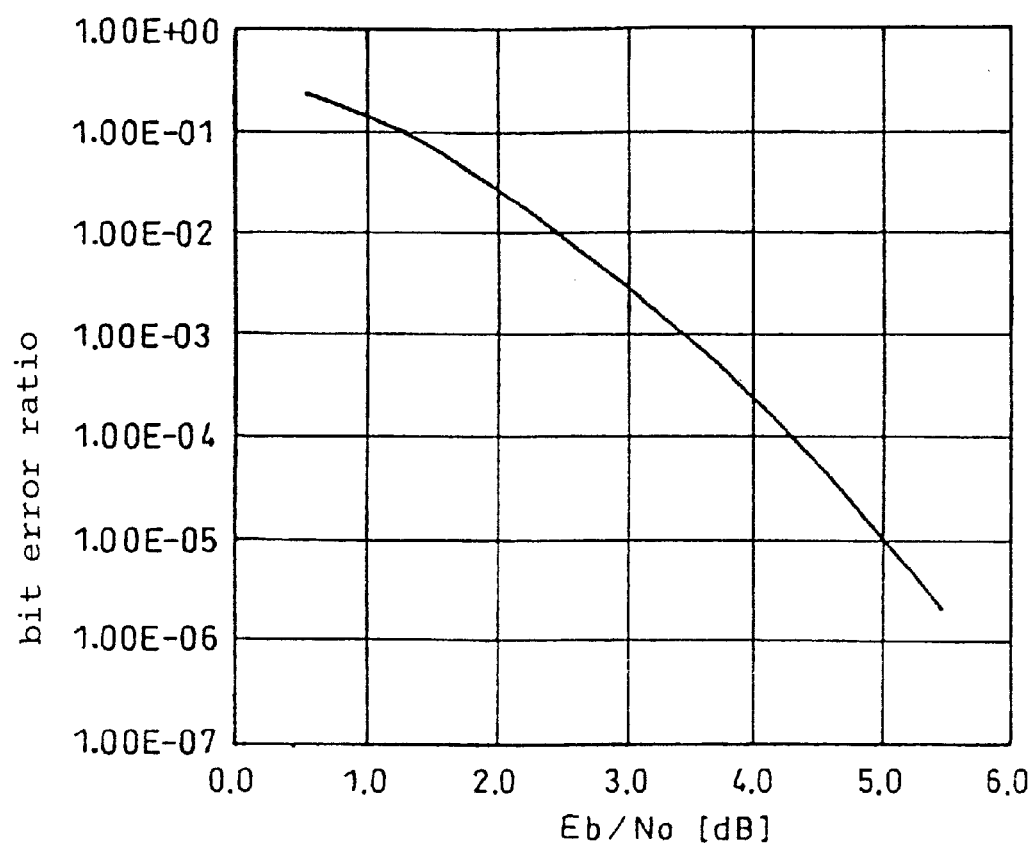
FIG. 6 is a characteristic diagram showing a relationship between a bit error ratio of a received signal in a spread spectrum communication scheme and a ratio of transmitted power Eb per bit of the received signal to noise power No falling in a band.

FIG. 6 is a graph showing a relationship of a bit error rate to received power. While Eb/N0 (dB), which is a rate of received power per bit to noise power falling within a band, is represented on the horizontal axis in this example, that may be generally considered as a signal power to noise power ratio (S/N ratio). As seen in FIG. 6, the bit error rate is uniquely defined for the S/N and a reduction in S/N leads to a deteriorated bit error rate. Thus, a threshold value is set for the bit error ratio such that a value equal to or higher than the threshold value means that the interference wave can be considered as mixed.

In this case, a received I component signal and a received Q component signal provided to baseband signal processing unit 410 are despread at despread unit 414 where only the signal in a desired channel is acquired from the received signal to calculate Eb/N0 (dB) as shown in FIG. 6, and the calculation result is provided to error rate calculator 413. Error rate calculator 413 derives the error rate corresponding to Eb/N0 (dB) and compares the error rate with the set threshold value, thereby deciding deterioration of the received signal.

In a spread spectrum communication scheme, a transmitter spreads the spectrum of a transmitted signal over a wideband using spread codes such as a pseudo noise code (PN code) for transmitted data (voice or image). In demodulating a received signal, a receiver performs despread with the same code as the spread code used for the spread spectrum on the transmitting side in the same spread timing. When the despread is correctly performed on the receiving side, only a desired channel can be acquired and all received signals through channels other than the desired channel are considered as noise signals. Thus, the despread at despread unit 414 enables the calculation of Eb/N0 (dB).

The operation of the embodiment is hereinafter described more specifically. Baseband signal processing unit 410 generates a control signal for changing the target value to control signal generating unit 411. Control signal generating unit 411 changes the target value used in controlling the gain of gain control amplifier 107 to again control the gain of gain control amplifier 107. The target value to be changed is determined as follows. Specifically, since a received power amount notified from power calculator 212 is obtained only from the desired wave since it is a power amount of the received signal after the interference wave is removed. For this received power, the error rate of the received signal calculated at error rate calculator 413 is referenced, and the amount of attenuation of the output power from gain control amplifier 107 is derived such that the error rate is at a desired value for the received power.

Since the derived attenuation amount is equal to a value of attenuation of the gain of gain control amplifier 107, a new target value based on the derived attenuation amount, that is, derived by subtracting the attenuation amount from the current target value, is set for control signal generating unit 411. When the receiver simultaneously receives the desired wave and the interference wave which exists with strong power to the desired wave in a channel adjacent to a received channel, baseband signal processing unit 410 can set the target value in control signal generating unit 411 in controlling the gain of gain control amplifier 107 by the receiver based on the error rate of the received signal. Therefore, the power of the interference wave saturates A/D converters 206 and 207 at the input ends thereof, and as a result, it is possible to prevent deteriorated reception characteristics and a deteriorated bit error rate in digital communication, allowing the objects of the present invention to be achieved.

Figure 7:
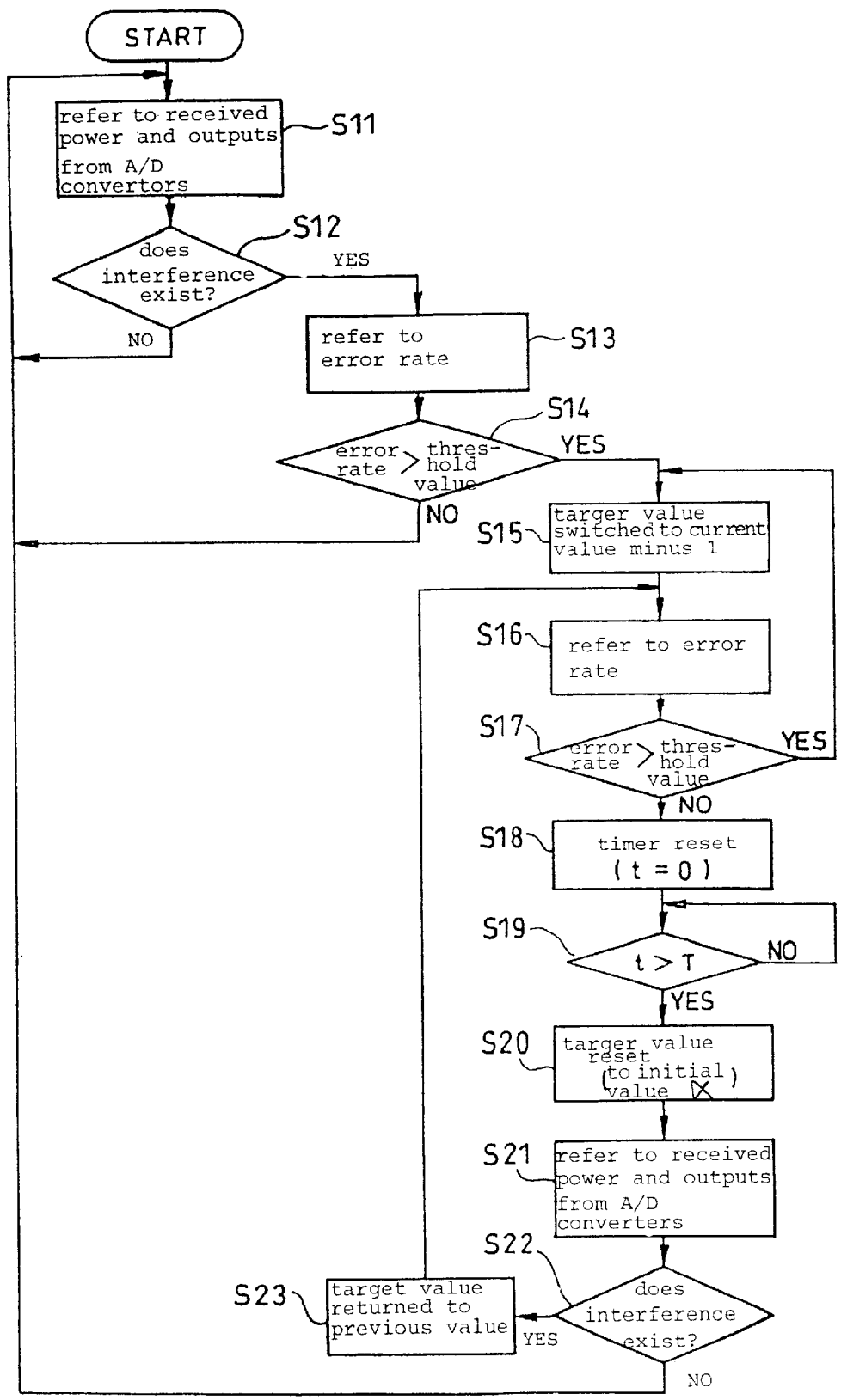
FIG. 7 is a flow chart showing the operation of the other embodiment of the present invention.

FIG. 7 is a flow chart showing the details of the operation of the embodiment. Referring to FIG. 7, reference is made to the received power calculated by power calculator 412 and the respective outputs from A/D converters 206 and 207 (step S11), and the presence and absence of any interference wave is detected (step S12). Specifically, if abnormality in the A/D converted outputs is detected while the received power is controlled at a target value (the initial set value α in this case), the error rate is referenced (step S13). If the error rate is larger than the set threshold value (step S13), an instruction is issued for switching from the current target value (α) to a target value (value derived by subtracting one) lower than the current value (α) by a certain amount (step S15).

The error rate at that point is referenced (step S16) and similarly compared with the set threshold value (step S17). The switching to a lower target value and the comparison with the threshold value for the error rate are repeated until the error rate is lower than the set threshold value. When the error rate is lower than the set threshold value at step S17, the state at that point is maintained for a certain time T (steps S18 and S19). The reason for setting the certain time T and the value of the time T are the same as those described at step S5 in the flow chart in FIG. 4. The target value is reset to the initial value α after the time T has elapsed (step S20).

The presence or absence of any interference wave is also detected at this state (steps S21 and S22), and if any interference wave is again detected, the target value is returned to the previous value (step S23), and the process returns to step S16. If no interference wave is detected at step S22, the process returns to first step S11.

As described above, according to the present invention, in the receiver with the function for maintaining constant amplification gain of the received signal by comparing the received power with the target value, the plurality of target values are set such that the target value is switched to the next lower target value when saturation occurs at the input ends of the A/D converters for digital processing of the received signal or deterioration of the received bit error rate occurs. Therefore, even when the received signal includes any interference wave in addition to the desired wave, it is possible to prevent saturation at the input ends of the A/D converters due to the interference wave to maintain favorable reception characteristics and to suppress an increase in bit error rate in digital communication.

Although certain preferred embodiments of the present invention have been shown and described in detail, it should be understood that various changes and modification may be made therein without departing from the scope of the appended claims.

What is claimed is:

1. A receiver comprising:

selecting means for selectively deriving and outputting a desired wave in a received wave;

gain control amplifying means for amplifying the output from said selecting means;

demodulating means for demodulating the amplified output;

digital signal processing means for digitally processing a baseband signal which is the demodulated output from said demodulating means, said digital signal processing means including a digital converter for digitizing said baseband signal and a filter for filtering out an interference wave component from the digital signal; and gain control means for comparing a power amount corresponding to the demodulated output with a selected one of a plurality of target values to control gain of said gain control amplifying means in accordance with the comparison result, said gain control means including target value switching control means for switching said selected one of said plurality of target values to another target value in accordance with the presence or absence of an interference wave contained in said demodulated output, and said target value switching control means including interference wave detecting means for detecting the presence or absence of said interference wave based on an output power amount from said filter and a saturated operation state of said digital converter and, wherein said interference wave detecting means detects said saturated operation state when said digital converter provides a continuous maximum output.

2. A receiver comprising:

selecting means for selectively deriving and outputting a desired wave in a received wave;

gain control amplifying means for amplifying the output from said selecting means;

demodulating means for demodulating the amplified output;

digital signal processing means for digitally processing a baseband signal of the demodulated output from said demodulating means, said digital signal processing means including a digital converter for digitizing said baseband signal and a filter for filtering out an interference wave component from the digital signal, and wherein;

gain control means for comparing a power amount corresponding to the demodulated output with a selected one of a plurality of target values to control gain of said gain control amplifying means in accordance with the comparison result, said gain control means including target value switching control means for switching said selected one of said plurality of target values to another target value in accordance with the presence or absence of an interference wave contained in said demodulated output, and said target value switching control means including interference wave detecting means for detecting the presence or absence of said interference wave based on an output power amount from said filter and a state of said digital converter, wherein said target values include a predetermined first target value and a predetermined second target value that is lower than said first target value, and wherein said target value switching control means sets said first target value to an initial set value at an initial state, and switches to said second target value when said interference wave detecting means detects said interference wave in that initial state.

3. The receiver according to claim 2, wherein said first target value is predetermined such that a received power amount at an input terminal of said digital converter causes no saturated operation of said converter in a normal receiving state with no interference wave present.

4. The receiver according to claim 2, wherein said target value switching control means switches said second target value to said first target value after a certain time has elapsed from the switching to said second target value.

5. The receiver according to claim 2, wherein said interference wave detecting means detects an error rate as an output state of said digital signal, and detects the presence or absence of said interference wave based on said error rate.

6. The receiver according to claim 5, wherein said interference wave detecting means detects the presence of said interference wave when said error rate is equal to or higher than a predetermined threshold value.

7. The receiver according to claim 6, wherein said target value switching control means switches said target value from said initial set value to said second target value which is lower than said initial set value by a certain amount when said error rate is equal to or higher than said threshold value.

8. The receiver according to claim 7, wherein said target value switching control means further switches said target value from said second target value to a third target value which is lower than said second target value by a certain amount when said error rate is equal to or higher than said threshold value.

9. The receiver according to claim 8, wherein said target value switching control means stops switching of said target value only when said error rate becomes lower than said threshold value.

10. The receiver according to claim 9, wherein said target value switching control means switches said target value to said initial set value after a certain time has elapsed after the stop of switching of said target value.

11. A method of controlling gain in a receiver, comprising the steps of:

selectively deriving and outputting a desired wave in a received wave;

amplifying the output of said selectively deriving step;

demodulating the amplified output;

digitally processing and outputting the demodulated output;

comparing a power amount corresponding to the demodulated output with a selected one of a plurality of target values for a power amount;

amplifying the selected output in accordance with the comparison result; and controlling switching of said selected one of said plurality of target values in accordance with the presence or absence of an interference wave contained in the demodulated output, wherein said receiver is designed to digitally process a baseband signal which is said demodulated output with a digital converter to filter out an interference wave component from the digital signal with a filter, said controlling step including an interference wave detecting step of detecting the presence or absence of said interference wave based on an output power amount from said filter and a saturated operation state of said digital converter, wherein said interference wave detecting step detects said saturated operation state when said digital converter provides a continuous maximum output.

12. A method of controlling-gain in a receiver, comprising the steps of:

selectively deriving and outputting a desired wave in a received wave;

amplifying the output of said selectively deriving step;

demodulating the amplified output;

digitally processing and outputting the demodulated output;

comparing a power amount corresponding to the demodulated output with a selected one of a plurality of target values for a power amount;

amplifying the selected output in accordance with the comparison result; and controlling switching of said selected one of said plurality of target values in accordance with the presence or absence of an interference wave contained in the demodulated output, wherein said receiver is designed to digitally process a baseband signal which is said demodulated output with a digital converter to filter out an interference wave component from the digital signal with a filter, said controlling step including an interference wave detecting step of detecting the presence or absence of said interference wave based on an output power amount from said filter and a saturated operation state of said digital converter, wherein said target values include a predetermined first target value and a predetermined second target value which is lower than said first target value, and wherein said controlling step sets said first target value to an initial set value at an initial state, and switches to said second target value when said interference wave detecting step detects said interference wave in that initial state.

13. The method of controlling gain according to claim 12, wherein said first target value is predetermined such that a received power amount at an input terminal of said digital converter causes no saturated operation of said converter in a normal receiving state with no interference wave present.

14. The method of controlling gain according to claim 12, wherein said controlling step switches said second target value to said first target value after a certain time has elapsed from the switching to said second target value.

15. The method of controlling gain according to claim 12, wherein said interference wave detecting step detects an error rate as the output state of said digital signal, and detects the presence or absence of said interference wave based on said error rate.

16. The method of controlling gain according to claim 15, wherein said interference wave detecting step detects the presence of said interference wave when said error rate is equal to or higher than a predetermined threshold value.

17. The method of controlling gain according to claim 16, wherein said controlling step switches said target value from said initial set value to said second target value which is lower than said initial set value by a certain amount when said error rate is equal to or higher than said threshold value.

18. The method of controlling gain according to claim 17, wherein said controlling step further switches said target value from said second target value to a third target value which is lower than said second target value by a certain amount when said error rate is equal to or higher than said threshold value.

19. The method of controlling gain according to claim 18, wherein said controlling step stops switching of said target value only when said error rate becomes lower than said threshold value.

20. The method of controlling gain according to claim 19, wherein said controlling step switches said target value to said initial set value after a certain time has elapsed after the stop of switching of said target value.

21. The method of controlling gain according to claim 20, wherein said controlling step switches said target value to a previous target value when said interference wave is again detected after the switching to said initial set value.

* * * * *